United States Patent [19]
Angelopoulos et al.

[11] Patent Number: 6,132,644
[45] Date of Patent: Oct. 17, 2000

[54] ENERGY SENSITIVE ELECTRICALLY CONDUCTIVE ADMIXTURES

[75] Inventors: Marie Angelopoulos, Cortlandt Manor; Edward D. Babich; Inna V. Babich, both of Chappaqua; Kuang-Jung Chen, Poughkeepsie; Wayne Martin Moreau, Wappingers Falls; David E. Seeger, Congers, all of N.Y.

[73] Assignee: International Business Machines Corporation, Armonk, N.Y.

[21] Appl. No.: 09/086,238

[22] Filed: May 28, 1998

Related U.S. Application Data
[60] Provisional application No. 60/047,769, May 29, 1997.

[51] Int. Cl.[7] .................... H01B 1/12; H01B 1/20
[52] U.S. Cl. ................................................ 252/500
[58] Field of Search ........................... 252/500; 528/210, 528/422

[56] References Cited

U.S. PATENT DOCUMENTS

| | | | |
|---|---|---|---|
| 5,137,799 | 8/1992 | Kaempf et al. | 430/270 |
| 5,198,153 | 3/1993 | Angelopoulos et al. | 252/500 |
| 5,370,825 | 12/1994 | Angelopoulos et al. | 252/500 |
| 5,721,299 | 2/1998 | Angelopoulos et al. | 524/177 |

*Primary Examiner*—Mark Kopec
*Attorney, Agent, or Firm*—Daniel P. Morris

[57] ABSTRACT

The present invention is an admixture of an electrically conductive material and an energy sensitive material resulting in a conductive energy sensitive composition. The structures are useful for lithography in microelectronic fabrication to avoid the effects of charging on resists from electron beams. The compositions are also useful in applications of scanning electron metrology and static dissipation.

7 Claims, 13 Drawing Sheets

| o-hydroxy-ethylaniline feed (by mol) | Incorporated | $M_n$ | PDI | Conversion |
|---|---|---|---|---|
| 1 | 2% | 22,000 | 1.93 | 19 |
| 5 | 17 | ~17,000 | | 18 |
| 10 | 23 | 14,000 | 1.59 | 18 |
| 20 | 35 | 13,000 | 1.59 | 19 |
| 30 | 44 | 12,000 | 1.54 | 19 |
| 50 | 66 | 12,000 | 1.51 | 18 |
| 100 | 100 | 13,000 | 1.55 | 27 |

Incorporated measured via 300 MHz $^1$H NMR in DMSO.
Molecular weights measured via GPC with NMP eluent and 0.5% LiCl
Yield after purification.

Fig. 4

| Hydroxyethyl content | CSA | Aampsa |
|---|---|---|
| 17 | .018 S cm⁻¹ | .050 |
| 23 | .025 | .044 |
| 35 | .028 | .034 |
| 44 | .023 | .022 |
| 66 | .13 | .10 |
| 100 | 1.2 | 1.1 |

2-Acrylamido-2-methyl-1-propanesulfonic acid

Camphorsulfonic acid

ENERGY SENSITIVE ELECTRICALLY CONDUCTIVE ADMIXTURES

This application claims priority from Provisional Application Serial No. 60/047,769 which was filed on May 29, 1997.

FIELD OF THE INVENTION

The present invention is directed to energy sensitive electrically conductive materials formed from an admixture of an electrically conductive material and an energy sensitive material, structures fabricated therewith and methods of fabrication thereof. More particularly the present invention is directed to a conductive energy sensitive resist material.

BACKGROUND OF THE INVENTION

In many industrial applications a pattern is created in a layer at the surface of a fabricated object. For example, electronic devices such as semiconductor chips are formed from multilevel structures having layers of patterned semiconducting materials, metals, and dielectric materials. In microelectronics the various intricate patterns necessary to form, for example, the various doped regions of silicon on a chip or their interconnections or the various interconnections on a package are delineated by lithographic techniques. Lithography relies on energy sensitive materials generally called resists. An energy sensitive material is disposed on a surface. The layer of energy sensitive material is exposed to a pattern of energy which alters the properties of the layer in the exposed regions so that either the exposed or unexposed regions can be subsequently removed to form a pattern in the energy sensitive layer. In positive acting resists the exposed regions generally become more soluble than the unexposed regions whereas in negative acting resists the exposed regions become more insoluble. The more soluble regions are generally removed with a suitable solvent during the development step. In both the positive and negative resists, after development, a pattern has been generated in the resist or energy sensitive layer. This pattern can then be transferred down to underlying layers by various etching mechanisms.

Where the pattern of energy results in generation of electrical charge or carries an electrical charge such as in electron beam lithography, electrical charge can in turn accumulate at the energy sensitive layer or in the underlying layers which can result in distortion of the pattern being created in the energy sensitive layer. Such distortions create huge image placement variations and errors. This occurs when a dielectric energy sensitive material such as a resist is exposed to a charged beam such as an electron beam or an ion beam. The dielectric energy sensitive layer accumulates charge from the beam. The accumulated charge introduces electric fields which after reaching a sufficient magnitude distorts the beam and results in a misplacement of the beam on the energy sensitive material. This creates errors in the pattern being formed in the layer.

In addition, charging is a problem in metrology. Metrology of device wafers or masks is generally done by Scanning Electron Microscopy (SEM). As IC device features continue to decrease into the sub 0.5 um region, SEM is becoming a commonplace technique for the inspection and dimensional measurements (metrology) of these circuits. Charging of the sample during SEM makes accurate metrology difficult. As an electric field builds up on the sample, the electron beam can be deflected. Even a very small beam deflection around a feature can move the beam one or two pixel points. If this occurs, substantial error is introduced into the measurement of the critical dimensions. One method to somewhat alleviate the charging problem is to do SEM at low accelerating voltages. However, at such voltages the resolution of the measurements is sacrificed.

Figure 1A:
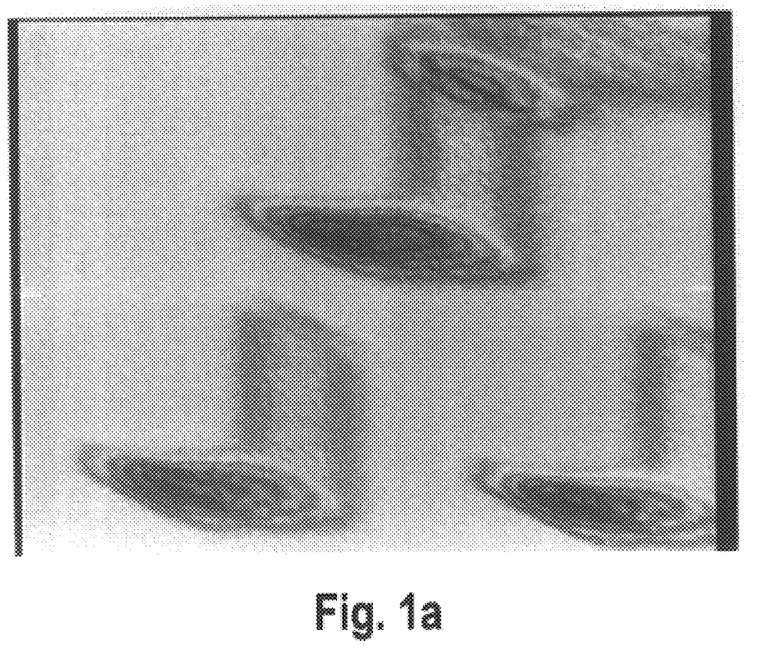
FIG. 1 is a pattern written with electron beam exposure: (a) pattern written with no conducting layer on top of the resist; severe image distortion observed due to charging of insulating resist (b) pattern written with a conducting layer on top of the resist; well defined feature observed as a result of no charging.
Figure 1B:
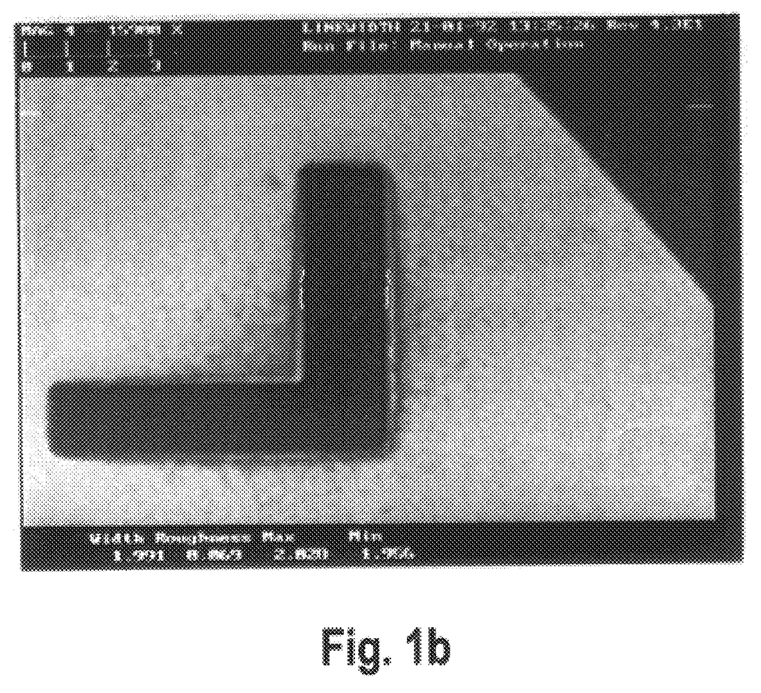
Figure 2A:
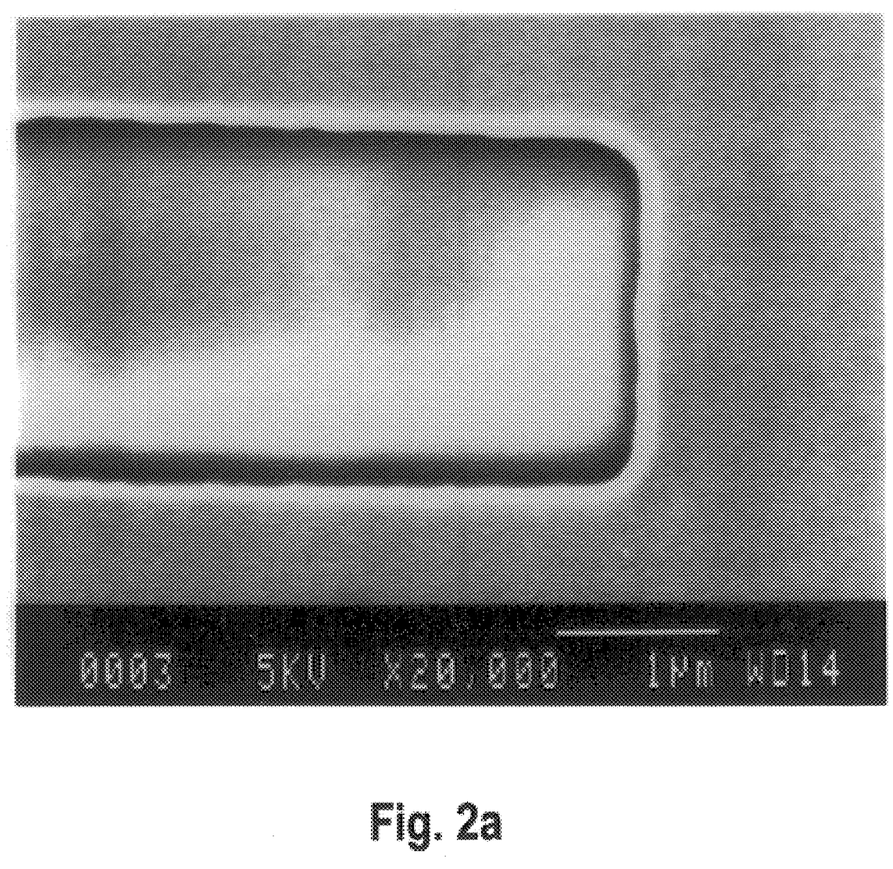
FIG. 2 depicts SEM metrology of (a) an uncoated mask; charging observed and (b) a mask coated with a conducting polymer; no charging observed.
Figure 2B:
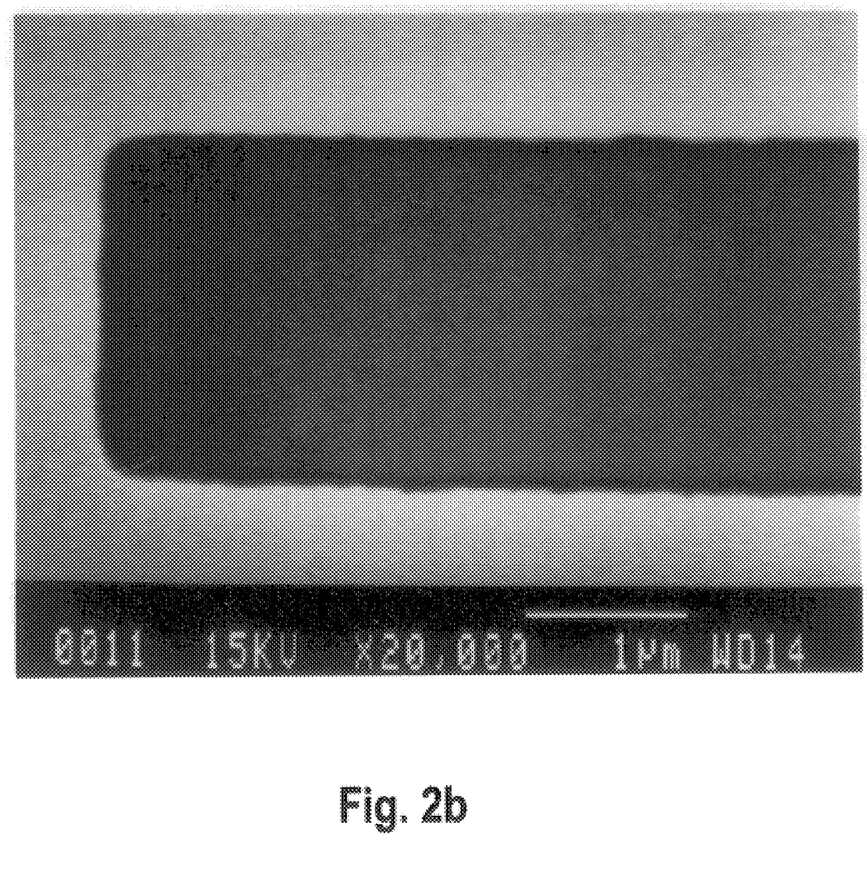

Previously we disclosed the use of a conducting polymer applied to the surface of the imaging resist or on the surface of a device wafer or mask being inspected to eliminate charging (U.S. Pat. Nos. 5,198,153, 5,200,112, 5,202,061 and 5,370,825, the teaching of which is incorporated herein by reference). In particular, a water soluble polyaniline was found to be easily applied on to the surface of a resist or mask or device wafer to eliminate charging during electron beam exposure or during SEM metrology. FIG. 1 depicts a pattern that was written with electron beam with no conducting polymer layer (a) and a pattern written with a thin coating of the polyaniline (1000–2000 A) (b). Significant image distortion is observed in (a) whereas a more well defined feature is observed (b). In addition, FIG. 2 depicts SEM metrology of a mask that is uncoated (a) and metrology of a mask that is coated with the polyaniline (b). As can be seen, no charging is observed in(b).

Although this process of applying a secondary conducting coating works well in eliminating charging, it is not an ideal solution. For SEM metrology, the coating can alter the critical dimensions being measured. The coating can introduce defects during its application and during its removal. A more desirable process would be to have an inherently conducting or dissipative resist system. This would eliminate the need for secondary dissipative coatings.

Herein, an admixture of an energy sensitive layer and a layer of an electrically conducting material is disclosed thereby forming an inherently conducting resist. The conducting resist allows direct imaging with a charged beam and allows high resolution SEM metrology.

Electrically conductive organic polymers are a class of electronic materials that combine the electrical properties of metals with the processability and mechanical properties characteristic of conventional polymers. Examples of such polymers include polyparaphenylene vinylenes, polyparaphenylenes, polyanilines, polythiophenes, polyazines, polyfuranes, polypyrroles, polyselenophenes, poly-p-phenylene sulfides, polythianapthenes, polyacetylenes formed from soluble precursors, combinations thereof and blends thereof with other polymers and copolymers of the monomers thereof.

These polymers are conjugated systems which are made electrically conducting by doping. The non-doped or non-conducting form of the polymer is referred to herein as the precursor to the electrically conducting polymer. The doped or conducting form of the polymer is referred to herein as the conducting polymer. Herein admixtures of electrically conducting polymers with energy sensitive materials are disclosed.

OBJECTS

It is an object of the present invention to provide an electrically conducting, energy sensitive material.

It is an object of the present invention to provide energy sensitive electrically conductive polymeric materials formed from an admixture of an electrically conductive material and an energy sensitive material.

It is another object of the present invention to provide structures fabricated with the admixtures of the present invention.

It is another object of the present invention to provide methods of fabricating the admixtures of the present invention.

It is another object of the present invention to provide an energy sensitive resist material using the admixture of the present invention.

It is another object of the present invention to provide structures having patterns of electrically conductive polymer admixtures on a surface.

SUMMARY OF THE INVENTION

A broad aspect of the present invention is an admixture of an electrically conductive polymer and an energy sensitive material.

Another broad aspect of the present invention is a structure having a surface having thereon an electrically conductive polymer admixture according to the present invention.

A more particular aspect of the present invention is a structure having a surface having a pattern thereon of an electrically conductive polymer admixture according to the present invention.

Another broad aspect of the present invention is a method of disposing on a surface an electrically conductive admixture according to the present invention and exposing the layer to an energy beam and optionally forming a pattern in the layer using a patterned energy beam.

BRIEF DESCRIPTION OF THE DRAWINGS

Further objects, features, and advantages of the present invention will become apparent from a consideration of the following detailed description of the invention when read in conjunction with the drawing FIGS., in which.

DETAILED DESCRIPTION

The present invention is directed to conducting energy sensitive materials referred herein as conducting resists. The resists which are currently used in the microelectronics industry are insulators. As device geometries continue to shrink below 500 nm, great demand is put on the resist to resolve such dimensions with a relatively large process latitude including dose and focus latitude. The resist should also exhibit good sensitivity to a given radiation, exhibit high contrast, good dissolution properties, and low absorption at a given radiation. The resist should also be environmentally stable and not significantly dependent on temperature (bake nonuniformities) in particular during the post apply bake and post exposure bake steps.

As current resists used in the industry are insulators, these resists charge during exposure to a charged beam of radiation. To introduce conducting properties into the resist, a conducting material is blended with a given resist. In doing this, it is imperative that the lithographic performance of the resist is not sacrificed. The challenge is to identify the appropriate conductor that blends well with a given resist. To do this effectively, the solubility characteristics of the conductor and the resist should be similar or tuned. The conductor should render the resist conducting at low loadings of the conductor in order to minimize any degradation of lithographic performance. In addition, the conductor can not poison the resist. Many resists in the industry are chemically amplified (CA), i.e. function by catalyzation by acid. They consist of a photoacid generator (PAG) and a polymer containing acid sensitive deblockable groups. Upon irradiation, the PAG forms an acid. This acid begins to deblock the acid sensitive functional groups on the polymer. The key to the high performance of the CA resists is that only a catalytic amount of acid is necessary to start a very efficient deprotection reaction. The reason for this is that the acid which is formed upon irradiation is only a catalyst. As it begins to deprotect the acid sensitive functional groups, additional acid is released from the deprotection mechanism which then acts as a catalyst for subsequent deprotection. Thus, one proton begins a cascade of reactions which are self catalyzed. Because of this mechanism, CA resists are very efficient and have very high sensitivity. At the same time, because of this sensitivity to acid, they are easily contaminated by any traces of acid thereby destroying the excellent lithographic performance of the resist.

It is therefore imperative that any conductor that is added does not have excess acid functionality that can destroy the lithographic performance of the resist. Many resists are sensitive to bases and other contaminants. Therefore the chemical nature of the conductor needs to be controlled to prevent contamination of resist. For optical exposures, the addition of the conductor can not significantly alter the absorption characteristics of the material at a given wavelength.

Conductors that can be used to practice the present invention include substituted and unsubstituted polyparaphenylenes, polyparaphenylevevinylenes, polyanilines, polyazines, polythiophenes, poly-p-phenylene sulfides, polyfuranes, polypyrroles, polyselenophenes, polyacetylenes, combinations thereof and copolymers of the monomers thereof. The general formula for these polymers can be found in U.S. Pat. No. 5,198,153 to Angelopoulos et al. the teaching of which is incorporated herein by reference. The present invention will be described with reference to one type of polymer which is a substituted or unsubstituted polyaniline or copolymers of polyaniline having general formula shown in FIG. 3 wherein each R can be H or any organic or inorganic radical; each R can be the same or different; wherein each $R^1$ can be H or any organic or inorganic radical, each $R^1$ can be the same or different; $x \geq 1$; preferably $x \geq 2$ and y has a value from 0 to 1. Examples of organic radicals are alkyl or aryl radicals. Examples of inorganic radicals are Si and Ge. This list is exemplary only and not limiting.

Figure 3A:
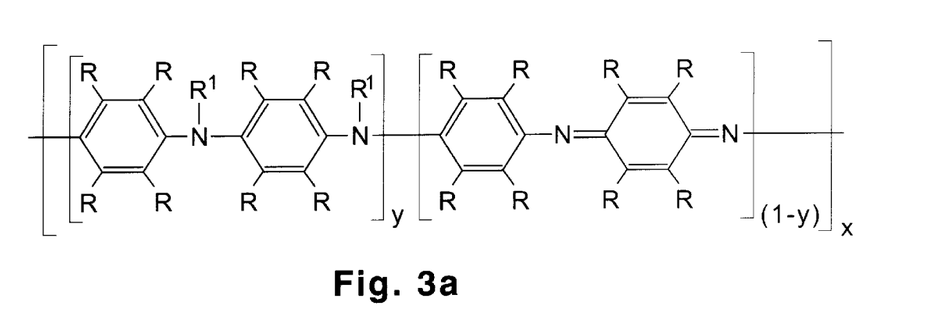
FIG. 3 is a general formula for a polyaniline; (a) is the precursor form of the polymer or the non-doped form of the polymer; (b) is the doped form of the polymer or the electrically conducting form of polyaniline; (c) is the actual structure for the doped electrically conducting polymer consisting of a polysemiquinone radical cation.
Figure 3B:
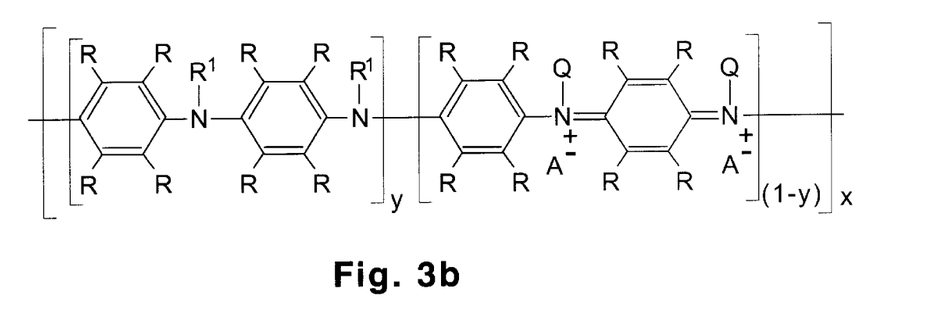

The precursor to the electrically conducting polymer form is shown in FIG. 3a. This is the non-doped form of the polymer or the base polymer. FIG. 3b shows polyaniline doped with a dopant. If the polyaniline base is exposed to cationic species QA, the nitrogen atoms of the imine part of the polymer becomes substituted with the Q+ cation to form an emeraldine salt as shown in FIG. 1b. Q+ can be selected from H+ and organic or inorganic cations, for example, an alkyl group or a metal.

Figure 3C:
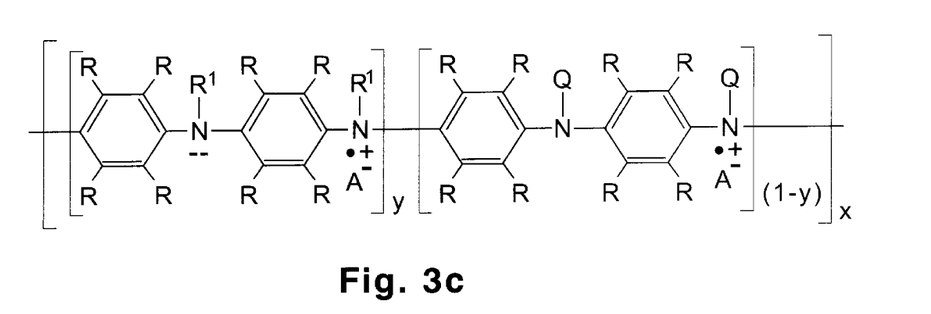

QA can be a protic acid where Q is hydrogen. When a protic acid HA is used to dope the polyaniline, the nitrogen atoms of the imine part of the polyaniline are protonated. The emeraldine base form is greatly stabilized by resonance effects. The charges distribute through the nitrogen atoms and aromatic rings making the imine and amine nitrogens indistinguishable. The actual structure of the doped form is a delocalized polysemiquinone radical cation as shown in FIG. 3c.

Polyaniline can exist in a number of oxidation states. The emeraldine form of the polymer refers to the material that consists of approximately equal number of benzenoid units and quinoid units (y=~0.5 in FIG. 3). The emeraldine polymer can be reduced to the leucoemeraldine polymer where y=1 in FIG. 3. The leucoemeraldine base form of the polymer is not stable in ambient conditions. The emeraldine polymer can be oxidized to the pernigraniline form where y=0; however, the fully oxidized form of the polymer also tends not to be stable. In principle, other oxidation states intermediate between y=0 and y=1 are possible. The emeraldine base form of the polyaniline is the most stable form. Because of its environmental stability, it is the form of polyaniline that has been the most abundantly studied and is the form that is suited for technological applications. The most preferred embodiment of the present invention is emeraldine base form of the polyaniline wherein y has a value of approximately 0.5.

Because the conducting polyaniline is generally made conducting by a protonic acid, it is important that no excess acid be present in the polymer, i.e. all acid should be complexed to the polyaniline. Otherwise the excess acid would contaminate the resist. In addition, the acid should not be easily decomplexed from the polyaniline backbone. The use of the volatile acid, hydrochloric acid, for example would not be appropriate as the hydrochloric acid can easily be lost from the polyaniline backbone at low temperature or under vacuum. No acid should be emitted from the polyaniline during the post apply resist bake nor during the post expose resist bake or under vacuum as is necessary for electron beam exposures. In addition, there should not be significant sites on the polyaniline backbone which are not complexed as resists tend to be sensitive to base as well. Polyaniline that is not complexed with a dopant is a base. The solubility of the polyaniline must be tuned to match the solubility characteristics of the resist in order to form a good blend at low loadings. The unsubstituted polyaniline is generally most soluble in NMP. NMP is not a desirable solvent for resist processing as NMP is basic and is known to be a contaminant for chemically amplified resists. The resist should be able to develop cleanly even with the incorporation of the polyaniline. The developer most widely used in the industry is aqueous tetramethyl ammonium hydroxide solution. It is not obvious that the resist blended with the polyaniline would develop cleanly because the polyaniline itself is not soluble in this developer. It is important, therefore, that the polyaniline loading in the resist be kept low so that the polyaniline does not disrupt the clean resist development.

SPECIFIC EXAMPLES

The unsubstituted polyaniline in the emeraldine form is synthesized by the chemical oxidative polymerization of aniline in 1N HCl using ammonium peroxydisulfate as an oxidizer. In the synthesis, the conducting polyaniline hydrochloride (emeraldine hydrochloride) salt precipitates from solution. The polymerization is allowed to proceed for several hours after which the powder is filtered, washed with excess 1N hydrochloric acid. The emeraldine hydrochloride is then converted to the non-conducting or non-doped emeraldine base by reaction with 0.1M ammonium hydroxide. The emeraldine base is then filtered, washed with ammonium hydroxide, then washed with methanol and dried. The polymer at this stage is in the undoped emeraldine base form as a powder.

Figure 4:
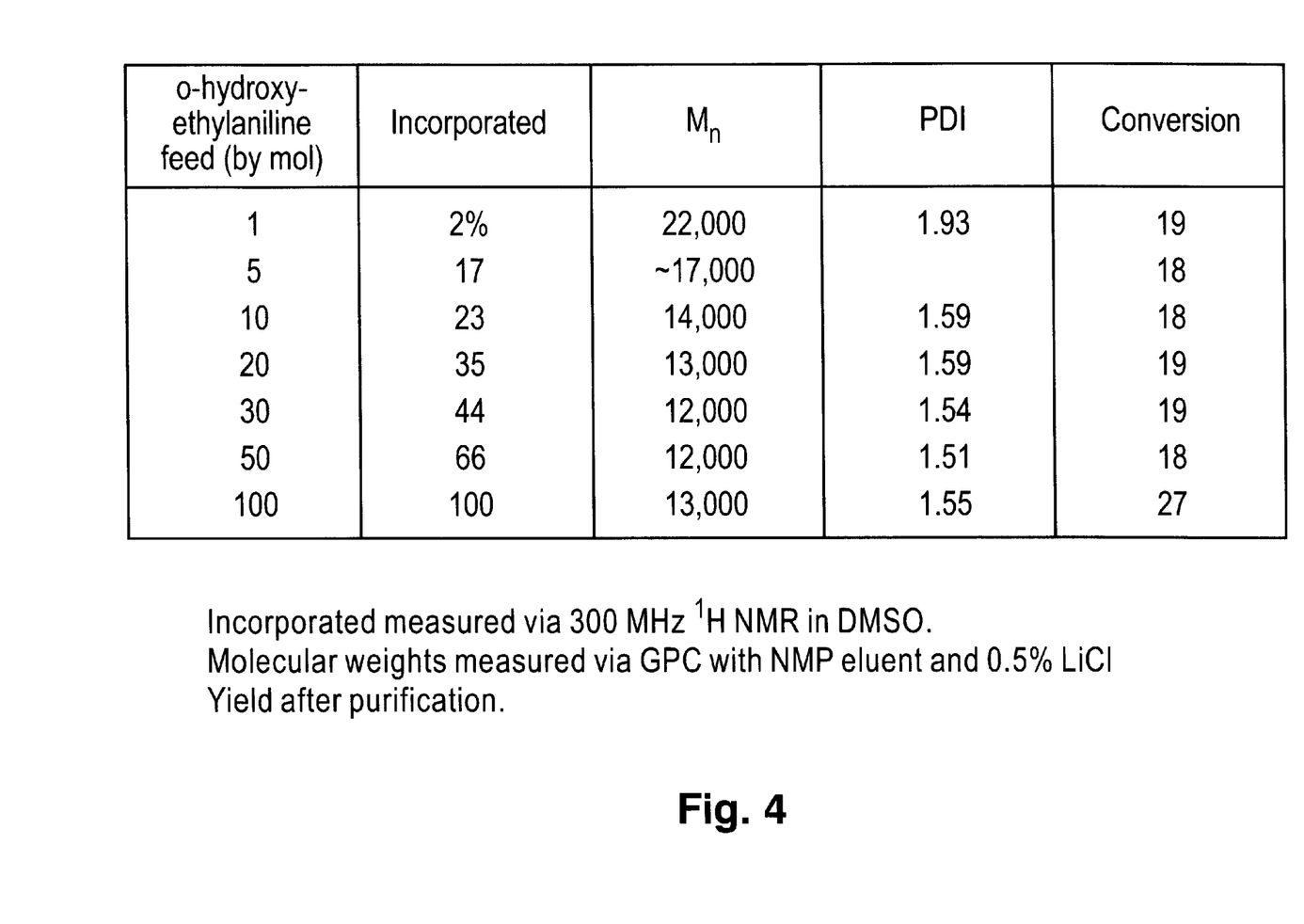
FIG. 4 shows the data for the synthesis of the poly(o-hydroxyethylaniline co-aniline) polymers.

Substituted (either on the aromatic ring or on the nitrogen) polyanilines in the emeraldine form are synthesized in the same fashion as above but using the appropriate substituted aniline monomer in the polymerization reaction. Copolymers are made by the oxidative polymerization of one or more monomers. Other acids can also be used in the polymerization reaction other than hydrochloric acid. Aqueous acetic acid, sulfuric acid, organic sulfonic acids, such as aqueous toluenesulfonic acid, dodecylbenzenesulfonic acid, camphorsulfonic acid, acrylamidopropanesulfonic acid and so on. The o-ethoxy substituted polyaniline was prepared by oxidative polymerization of o-ethoxy aniline in 1N hydrochloric acid as described above. Copolymers having various amounts of o-ethoxy content were synthesized by polymerizing o-ethoxyaniline and aniline in aqueous 1N hydrochloric acid. The amount of o-ethoxy content in the final polymer was controlled by varying the feed ratio of this monomer in the initial polymerization reaction. 8, 20, 40,60 , 70, and 100% ethoxy containing polyaniline was synthesized. The greater the incorporation of ethoxy content, the more soluble was the polymer. Hydroxyethyl substituted polyaniline was synthesized by the oxidative polymerization of hydroxyethylaniline. Copolymers of hydroxyethyl aniline with aniline were synthesized by copolymerizing hydroxyethyl substituted aniline with aniline in various feed ratios of hydroxyethyl aniline (FIG. 4). With increasing hydroxyethyl substitution, the solubility increases.

The substituted and unsubstituted emeraldine base powder is generally processed by dissolving the powder in an organic solvent. The unsubstituted emeraldine base was dissolved in NMP at a 5–10% concentration or DMPU. The ethoxy substituted and hydroxy substituted materials were significantly more soluble than the unsubstituted polyaniline in a variety of organic solvents including ethyl lactate, cyclohexanone, pgmea (propylene glygol dimethyl ether acetate), N-methylpyrrolidinone, diacetone alcohol, anisole and so on. This solubility is important in order to allow the conducting polymer to blend with a given resist. Substituted polyanilines are described in U.S. Pat. No. 5,160,457 the teaching of which is incorporated herein by reference.

The polyanilines in the nondoped form can be treated with a dopant such as hydrochloric acid, acetic acid, formic acid, polystyrenesulfonic acid, acrylamidopropanesulfonic acid, camphorsulfonic acid, polyacrylic acid and so fourth to render the material conducting. The most preferred dopants are 2-acrylamido-2-methyl-1-propane sulfonic acid, camphorsulfonic acid and dodecylbenzenesulfonic acid. The doping of the polymers was carried out by dissolving the base material in a solvent and then adding the dopant (1:2.1 molar stochiometry of 1 mole base repeat unit to 2.1 moles of acid dopant). The reaction was allowed to proceed for 12 hours at room temperature at which time the solution was filtered through a 0.2 um millipore filter.

Figure 5:
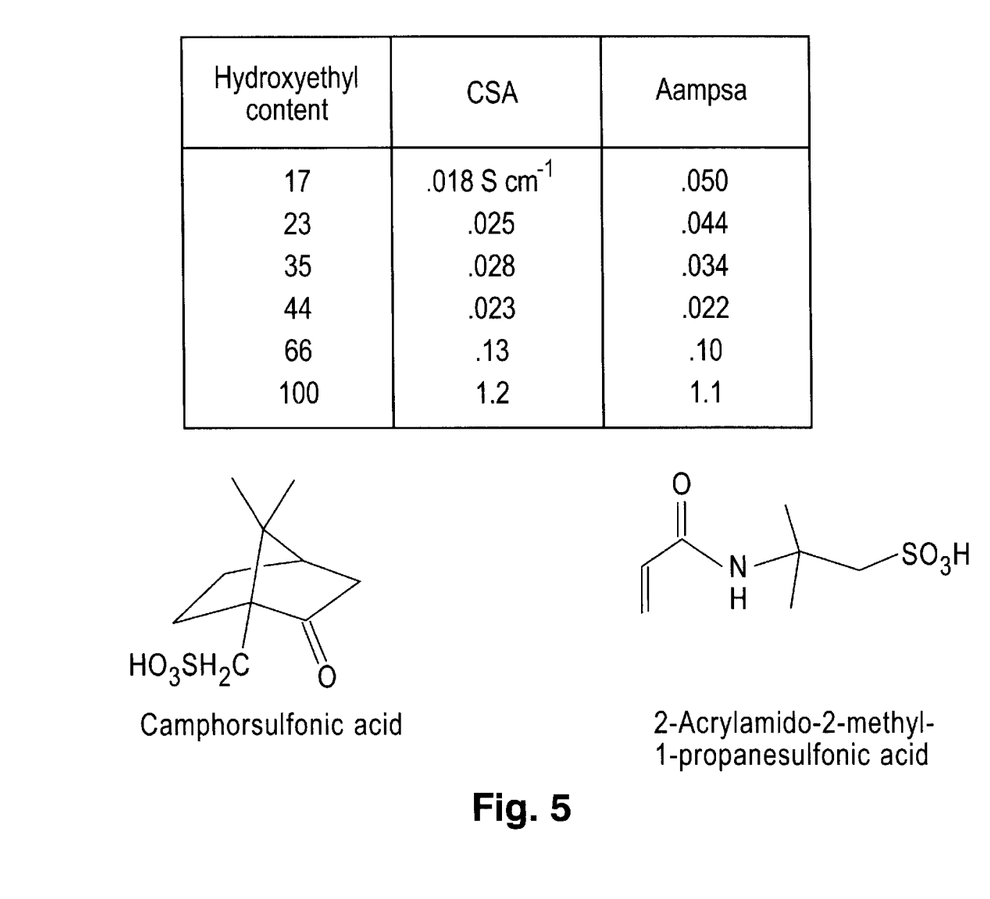
FIG. 5 shows the conductivity for the poly(o-hydroxyethylaniline co-aniline polymers, the unsubstituted polyaniline, and the o-ethoxypolyaniline.

The conductivity of the doped polymers are shown in FIG. 5. The conductivity is dependent on the particular solvent used for the processing. The substituted polyanilines because of their high solubility were good candidates to blend with resists commonly used in the industry.

Specific Examples of Conducting Resist Formulations

Figure 6:
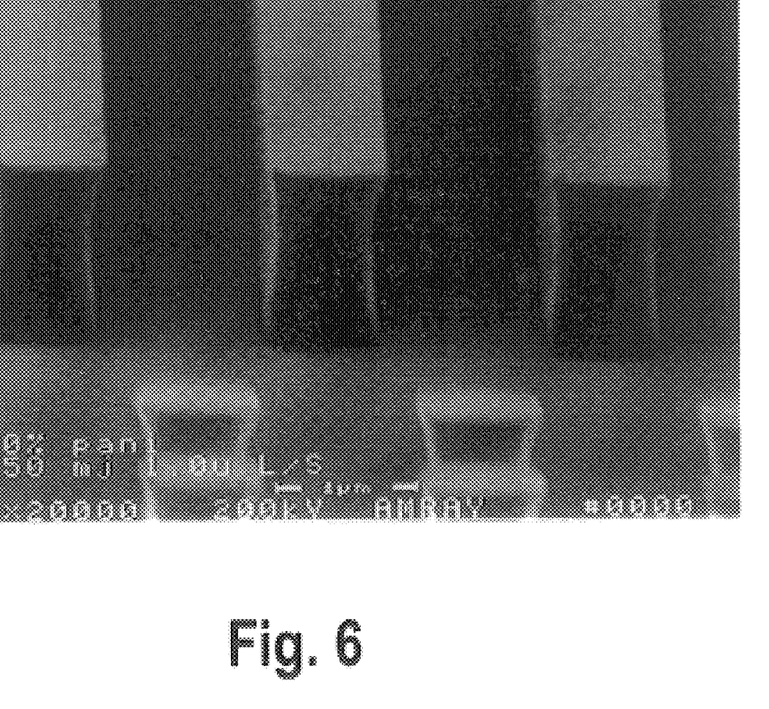
FIG. 6 shows 1.0 um lines/space patterns for a novolak resist containing no polyaniline.
Figure 7:
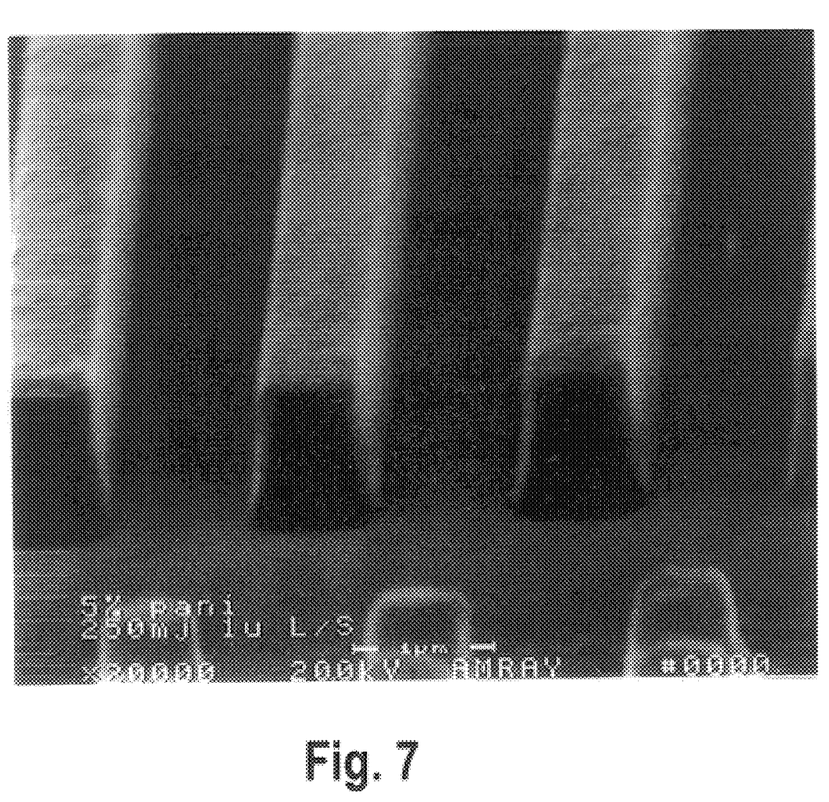
FIG. 7 shows 1.0 um lines/space patterns for a novolak resist containing 5% polyaniline (40% ethoxysubstituted copolymer doped with camphorsulfonic acid).
Figure 8:
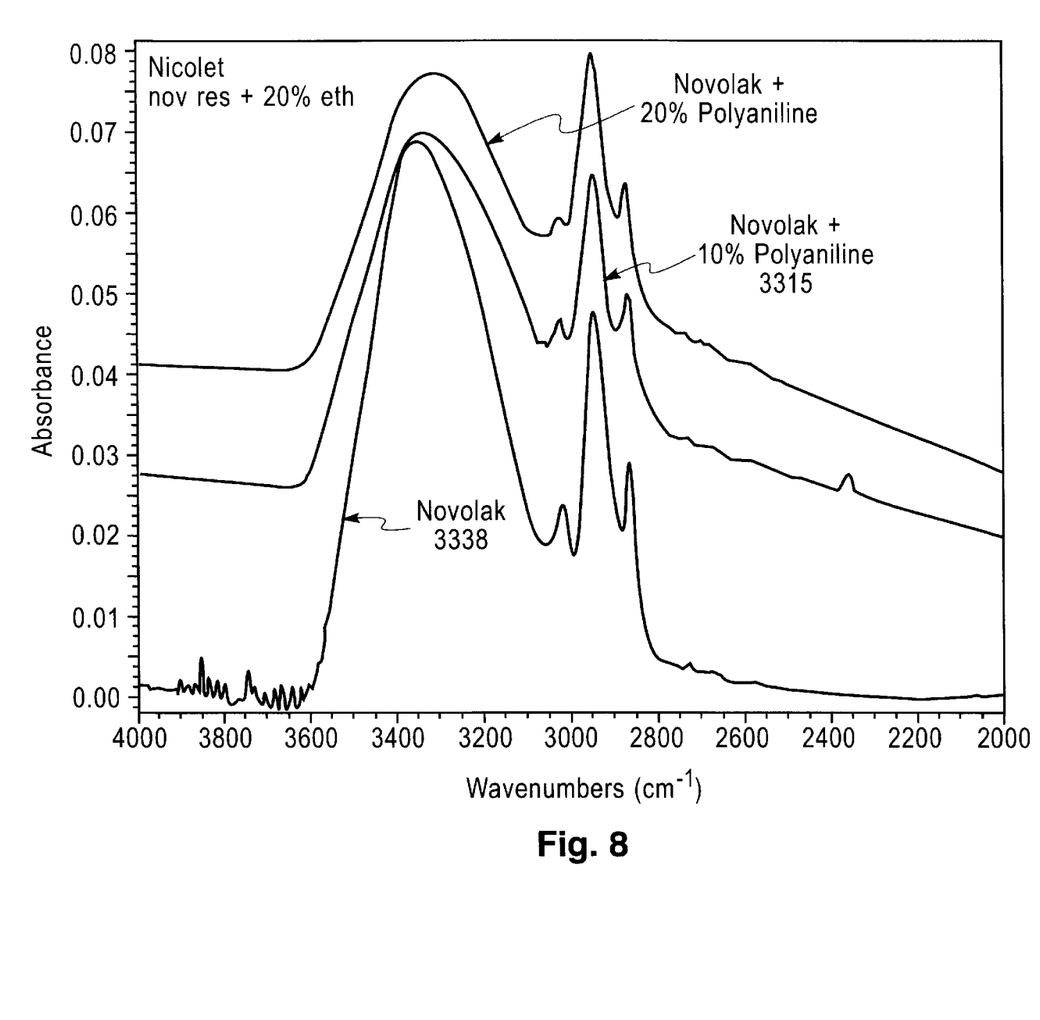
FIG. 8 shows the infra-red absorption (OH band) for novolak, novolak+10% ethoxypolyaniline and novolak+ 20% ethoxypolyaniline.

The 40% ethoxy substituted copolymer doped with camphorsulfonic acid having a conductivity of 10–5 S/cm was dissolved in PGMEA/Cyclohexanone to a concentration of 5% by weight. A second solution consisted of a typical i-line resist, novolak/diazonapthoquinone system in PGMEA/Cyclohexanone. The conducting polyaniline was added to the novolak resist formulation. Various solutions were made consisting of 1 to 20% by weight polyaniline. The two materials blended well, i.e. no precipitation was observed. No contamination of the resist was observed even upon standing at room temperature or extended storage in a refrigerator. 5% incorporation of polyaniline was sufficient to render the resist conducting (10–6 S/cm was achieved with 5% loading). Films were made with both solutions consisting of novolak alone and novolak with the polyaniline. The films were post apply baked at 110° C., exposed to UV irradiation, post expose baked at 110° C. and developed in an aqueous 0.24 N tetramethyl ammonium hydroxide solution. FIGS. 6 and 7 depict 1.0 um lines/space pattern written with the novolak with 0% polyaniline and with novolak written with 5% polyaniline respectively. As can be seen, the profiles on both looked good. No residue was apparent in the polyaniline case—the resist imaged well and developed well. At loadings above 10%, the images were not clean as considerable residue was present in the line/space pattern. FIG. 8 depicts the infra-red spectrum of the novolak resist, novolak with 10% ethoxy polyaniline and novolak with 20% ethoxy polyaniline. The OH stretching band shifted from 3338 to 3315 to 3305 with increasing polyaniline. This indicates that the phenolic OH stretch of the novolak hydrogen bonds with the polyaniline, indicating the two systems blended well.

Figure 9:
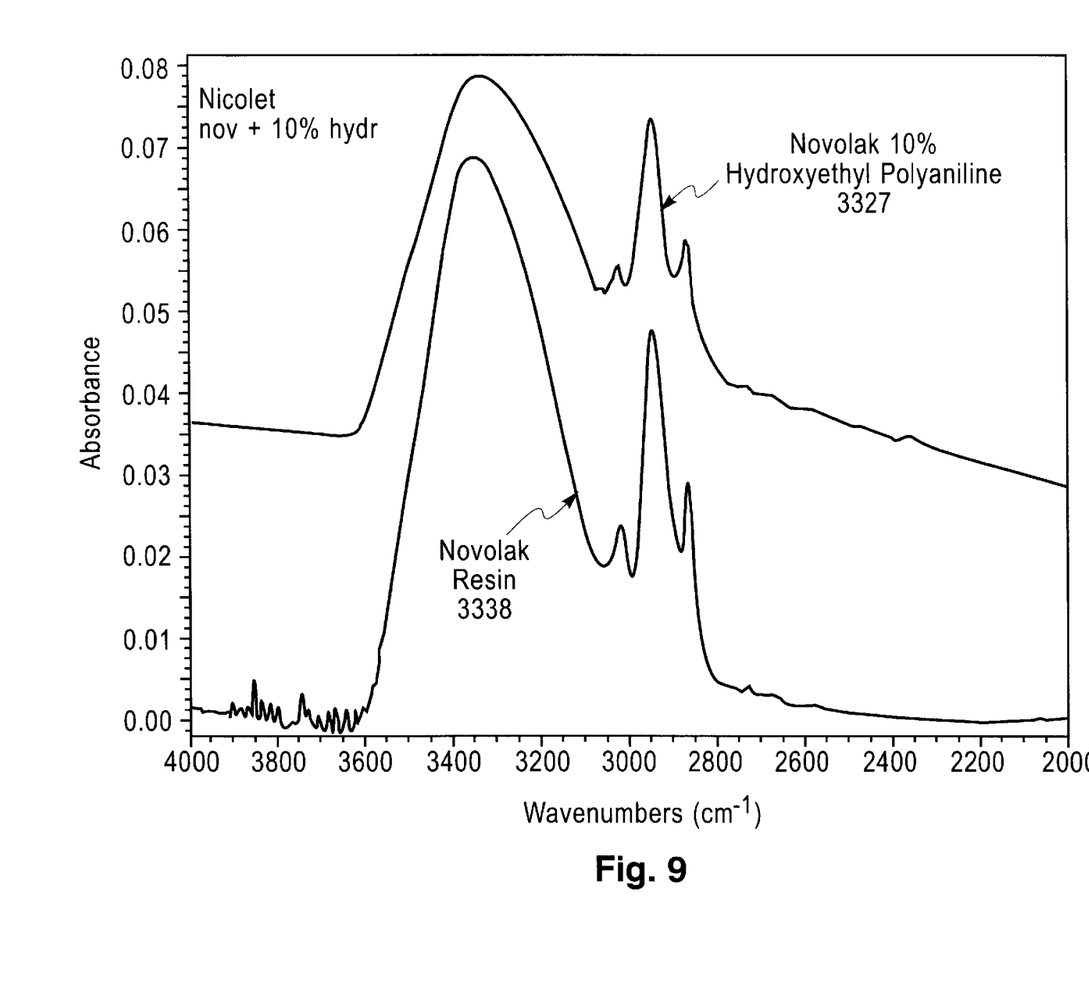
FIG. 9 shows the infra-red absorption (OH band) for novolak, and novolak+10% hydroxyethylpolyaniline.

The hydroxyethyl substituted polyanilines were soluble in an array of solvents and these too were blended with a novolak/diazonapthoquinone system at a loading of 0.1 to 25% (by weight relative to solids in the resist). It was found that because of the hydrogen bonding between the novolak and the hydroxyethyl substituent on the polyaniline, that the polymers blended well and that conductivity on the order of 10–3 S/cm was achieved with 3 to 5% loading of the polyaniline. FIG. 9 shows the infrared for the novolak and novolak with 10% hydroxyethylpolyaniline. Again, the phenolic OH has been shifted due to H-bonding with the polyaniline.

Figure 10:
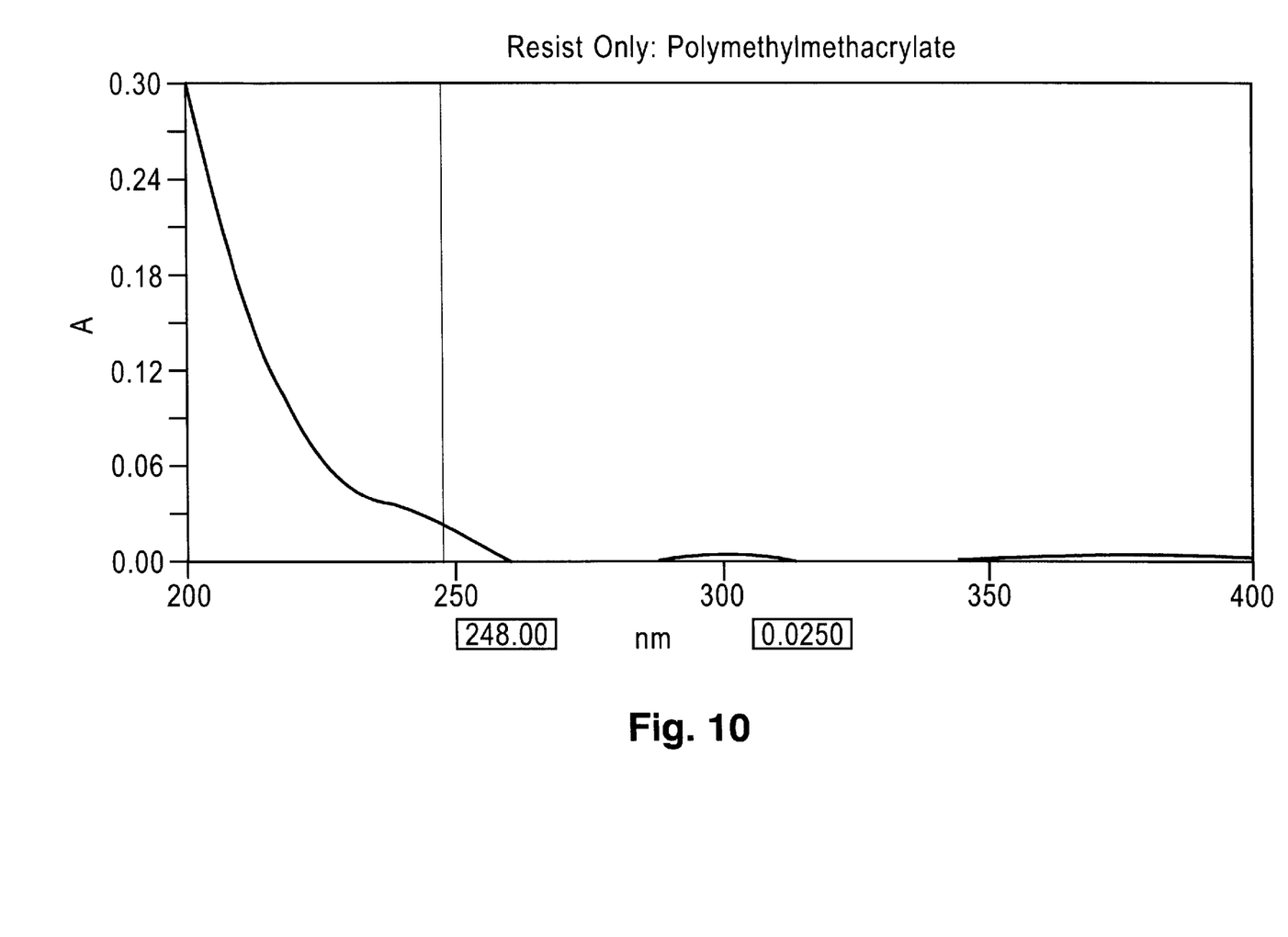
FIG. 10 shows the UV absorption for polyhydroxyethylmethacrylate resist alone at 248 nm.
Figure 11:
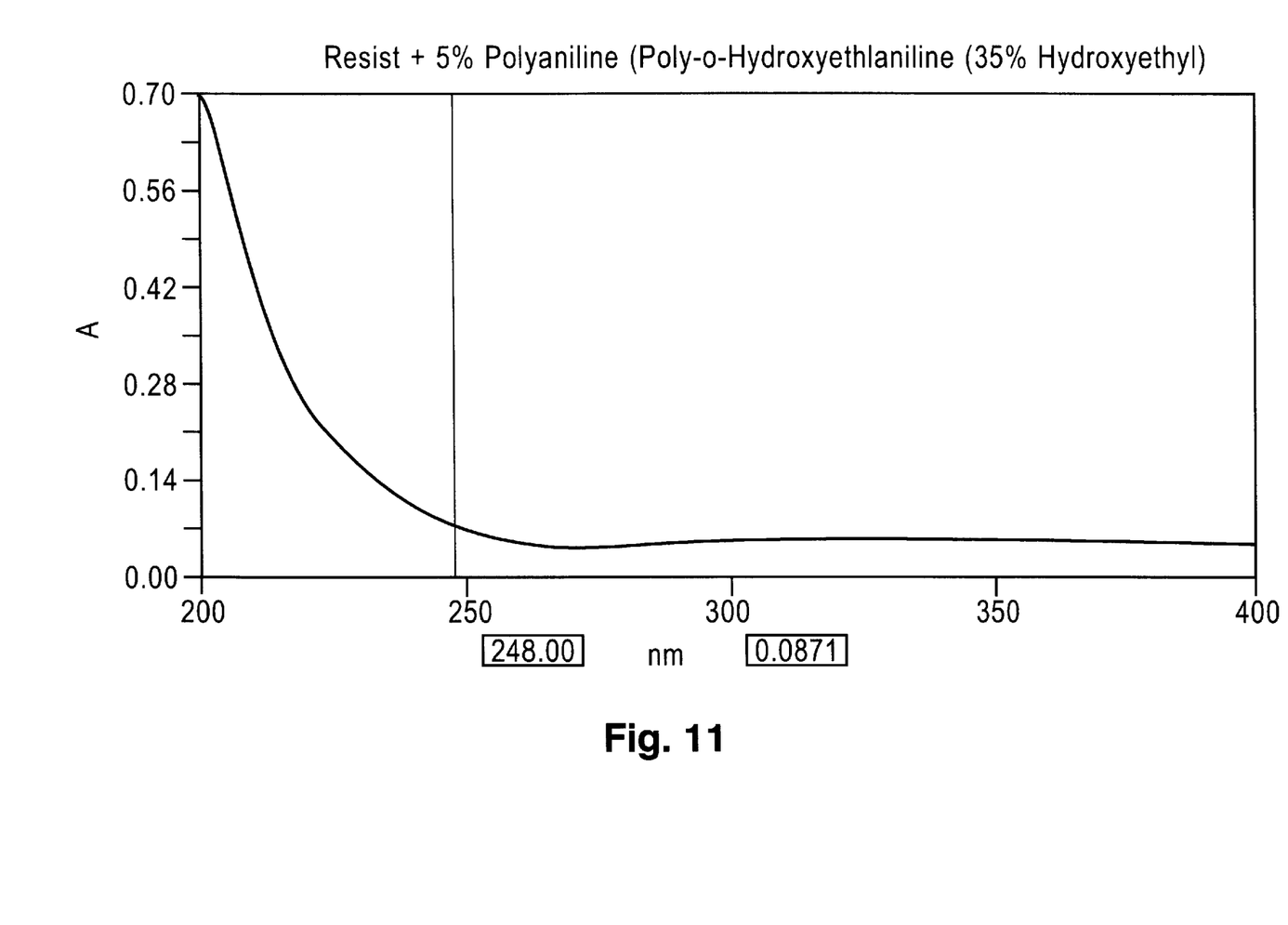
FIG. 11 shows the UV absorption for polyhydroxyethylmethacrylate resist with 5% polyaniline (35% hydroxyethyl containing polyaniline).
Figure 12:
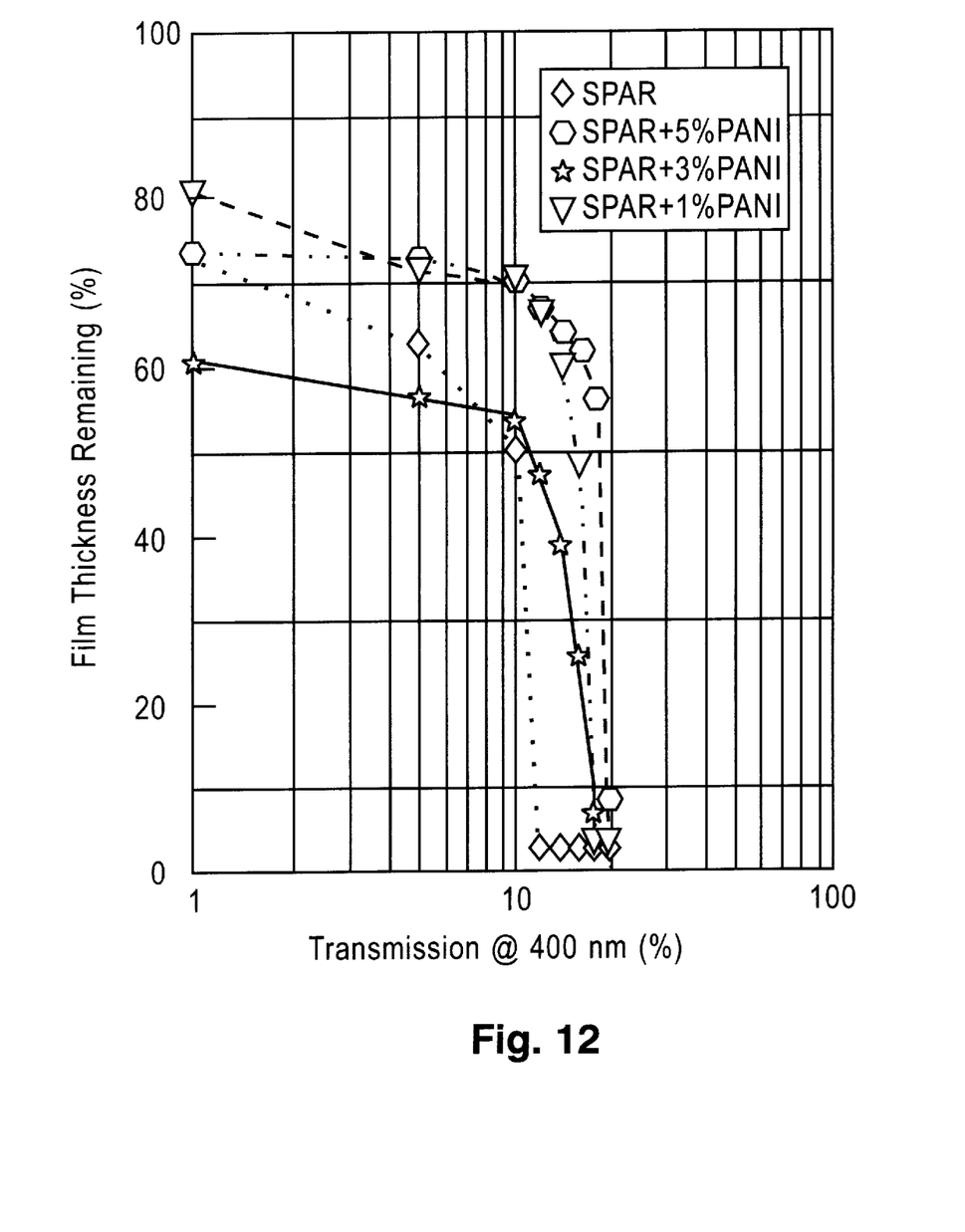
FIG. 12 shows the contrast curves for polyhydroxyethylmethacrylate based resist (SPAR) alone and with 1, 3, and 5% polyaniline.

The unsubstituted polyaniline doped with acrylamidopropanesulfonic acid in NMP and the ethoxy copolymers as well as the hydroxyethyl substituted polyanilines doped with camphorsulfonic acid as well as acrylamidopropanesulfonic acid in cyclohexanone were blended with a positive tone non chemically amplified resist based on polyhydroxyethylmethacrylate homopolymers and copolymers as described in U.S. application Ser. No. 08/717,644 filed on Sep. 23, 1996, the teaching of which is incorporated herein by reference. The polyanilines blended well with the resist. Good films were processed. The optical absorption of the resist was found not to change significantly with the addition of polyaniline (FIGS. 10 and 11) at 248 nm. Good lithography was attained as can be seen in FIG. 12 which shows the contrast of the resist alone and with 1, 3, and 5% polyaniline incorporation. It was actually found that the polyaniline increased the contrast.

The polyanilines were also blended with the Shipley UVx resists which are styrene based/t-butylmethacrylate systems, the e-beam sensitive polymethylmethacrylate, negative tone CGR (cross-linkable hydroxystyrene based system). These are examples only. Other resists which can be used to practice the present invention include: UVx series (IBM/Shipley products consisting of hydroxystyrene/t-butylmethacrylate copolymers and terpolymers thereof with other polymerizable units such as styrene, methylmethacrylate, and so fourth. Protected hydroxystyrene based polymers such as t-boc protected hydroxystyrene polymers, copolymers and terpolymers thereof with other polymerizable units. Methacrylate/acrylate polymers such as polymethylmethacrylate and derivatives thereof, SNR, CGR, KRS, Zep, silicon containing resists, PBS (polybutanesulfone), organometallic resists, novolak containing resists, novolak/diazoquinone resists, and so fourth. The resist can be + tone or – tone; it can be a single layer resist or multi-layer resist; chemically amplified and non chemically amplified. It can contain a cross-linker, a photoacid generator, an initiator, sensitizer, and so fourth. It can be a high molecular weight polymer or low molecular weight polymer or can consist of oligomeric or monomeric species. The following U.S. patents describe resists useful to practice the present invention are incorporated herein by reference: U.S. Pat. Nos. 5,401,614, 5,296,332, 5,240,812, 5,609,989, 5,593,812, 5,663,036, 5,654,376, 5,609,989, 5,607,824, 5,593,812, 5,585,220, 5,580,694, 5,554,485, 5,545,509, 5,492,793, 5,401,614, 5,296,332, 5,240,812, 5,071,730, 4,491,628, 5,585,220, 5,561,194, 5,547,812, 5,498,765, 5,486,267, 5,482,817, 5,464,726, 5,380,621, 5,374,500, 5,372,912, 5,342,727, 5,304,457, 5,300,402, 5,278,010, 5,272,042, 5,266,444, 5,198,153, 5,164,278, 5,102,772, 5,098,816, 5,059,512, 5,055,439, 5,047,568, 5,045,431, 5,026,624, 5,019,481, 4,940,651, 4,939,070, 4,931,379, 4,822,245, 4,800,152, 4,760,013, 4,551,418, 5,338,818, 5,322,765, 5,250,395, 4,613,398, 4,552,833, 5,457,005, 5,422,223, 5,338,818, 5,322,765, 5,296,332, 5,312,717, 5,229,256, 5,286,599, 5,270,151, 5,250,395, 5,238,773, 5,229,256, 5,229,251, 5,215,861, 5,204,226, 5,115,095, 5,110,711, 5,059,512, 5,041,358, 5,023,164, 4,999,280, 4,981,909, 4,908,298, 4,867,838, 4,816,112, 4,810,601, 4,808,511, 4,782,008, 4,770,974, 4,693,960, 4,692,205, 4,665,006, 4,657,845, 4,613,398, 4,603,195, 4,601,913, 4,599,243, 4,552,833, 4,507,331, 4,493,855, 4,464,460, 4,430,153, 4,307,179, 4,211,834, 4,491,628, 5,362,599, 5,378,511, 5,124,927, 4,493,855, 5,209,815, 5,296,332, 4,307,178, 5,362,599, 4,397,937, 5,567,569, 5,342,727, 5,294,680, 5,273,856, 4,980,264, 4,942,108, 4,880,722, 4,853,315, 4,601,969, 4,568,631, 4,564,575, 4,552,831, 4,522,911, 4,464,458, 4,409,319, 4,377,633, 4,339,522, 4,259,430, 5,209,815, 4,211,834, 5,260,172, 5,258,264, 5,227,280, 5,024,896, 4,904,564, 4,828,964, 4,745,045, 4,692,205, 4,606,998, 4,600,683, 4,499,243, 4,567,132, 4,564,584, 4,562,091, 4,539,222, 4,493,855, 4,456,675, 4,359,522, 4,289,573, 4,284,706, 4,238,559, 4,224,361, 4,212,935, 4,204,009, 5,091,103, 5,124,927, 5,378,511, 5,366,757, 4,590,094, 4,886,727, 5,268,260, 5,391,464, 5,115,090, 5,114,826, 4,886,734, 4,568,601, 4,678,850, 4,543,319, 4,524,126, 4,497,891, 4,414,314, 4,414,059, 4,398,001, 4,389,482, 4,379,826, 4,379,833, 4,187,331, 5,457,005; 5,422,223; 5,338,818; 5,322,765; 5,312,717; 5,279,926, 5,259,926, 5,286,599; 5,270,151; 5,250,395; 5,238,773; 5,229,256; 5,229,251; 5,215,861; 5,204,226; 5,115,095; 5,110,711; 5,059,512; 5,041,358; 5,023,164; 4,999,280; 4,981,909; 4,908,298; 4,867,838; 4,816,112; 4,810,601; 4,808,511; 4,782,008; 4,770,974; 4,693,960; 4,692,205; 4,665,006; 4,657,845; 4,613,398; 4,603,195; 4,601,913; 4,599,243; 4,552,833; 4,507,331; 4,493,855; 4,464,460; 4,430,153; 4,307,179; 4,307,178.

In the admixture the conductive polymer is from about 0.1% to 30% by weight, preferably from about 0.5% to 20% and most preferably from about 1% to 10%.

CGR is a negative deep UV chemically amplified resist consisting of polyhydroxystyrene polymer or copolymers with styrene or hydrogenated styrene with a powderlink crosslinker and a PAG. SNR is a Shipley negative DUV chemically amplified resist. SNR stands for Shipley Negative Resist. It is a poly hydroxy styrene. It contains a melamine crosslinker and a PAG. KRS is a positive deep-uv chemically amplified resist. KRS stands for Ketal Resist System. The chemical components are poly hydroxy styrene, and acetal protected poly hydroxy styrene as copolymers. The PAG is tri phenyl sulfonium triflate. UV3 is an IBM/Shipley positive DUV chemically amplified resist. It contains poly hydroxy styrene and t-butly methacrylate copolymers. The PAG is t-butyl phenyl iodonium campor sulfonate. ZEP is an e-beam resist. It is not chemically amplified. It is an alpha chloro methacrylate and alpha methyl styrene copolymer.

Layered lithographic structures, pH control, neutralization and patterning are described in copending U.S. application Ser. No. 08/946,601 filed on Oct. 7, 1997 to Angelopoulos et al., the teaching of which is incorporated herein by reference.

While the present invention has been described with respect to preferred embodiments, numerous modifications, changes, and improvements will occur to those skilled in the art without departing from the spirit and scope of the invention.

What is claimed is:

1. A composition comprising:

an admixture of an energy sensitive material and an electrically conductive material;

said electrically conductive material contains acid functionality;

said electrically conductive material has a predetermined pH provided by acid neutralizing functionality;

said pH is predetermined to be in the range from about 1 to about 7;

said acid neutralizing functionality is selected from the group consisting of tetramethylammonium hydroxide, tetraethylammonium hydroxide, tetrabutylammonium hydroxide, triethylamine, pyridine, t-butoxide, morpholine, pyrrolidinone, potassium hydroxide, sodium hydroxide, lithium hydroxide, triphenylsulfonium hydroxide, primary, secondary and tertiary amines, proton sponge, sodium hydride;

said electrically conductive material is selected from the group consisting of substituted and unsubstituted polyparaphenylenes, polyparaphenylevevinylenes, polyanilines, polyazines, polythiophenes, poly-p-phenylene sulfides, polyfuranes, polypyrroles, polyselenophenes, polyacetylenes, combinations thereof and blends thereof with other polymers and copolymers of the monomers thereof;

said energy sensitive material is selected from the group consisting of hydroxystyrene/t-butylmethacrylate copolymers and terpolymers, hydroxystyrene/t-butylmethacrylate copolymers with styrene based monomers and methylmethacrylate based monomers, protected hydroxystyrene based polymers and copolymers with styrene and methylmethacrylate based monomers, cross-linkable hydroxystyrene based polymers, methacrylateacrylate polymers and derivatives selected from the group consisting of polymethylmethacrylate, a-chloromethacrylate based polymers or copolymers with other methacrylate monomers or styrene or a-methylstyrene monomers, silicon containing resists, polybutanesulfones and derivatives, organometallic resists, novolak containing resists and novolak/diazoquinone resists.

2. A composition of matter according to claim 1 wherein said electrically conductive material is from about 0.1% by weight of said admixture to about 30% of said admixture.

3. A composition of matter according to claim 2 wherein said electrically conductive material is from about 0.5% by weight of said admixture to about 20% of said admixture.

4. A composition of matter according to claim 3 wherein said electrically conductive material is from about 1% by weight of said admixture to about 10% of said admixture.

5. A composition according to claim 1 wherein said energy sensitive admixture is sensitive to energy selected from the group consisting of electromagnetic radiation and a particle beam.

6. A composition according to claim 5 wherein said particle beam is selected from the group consisting of an electron beam and an ion beam.

7. A composition according to claim 1 wherein said energy sensitive admixture further includes a photosensitive agent.

* * * * *